United States Patent
Banovetz et al.

(10) Patent No.: US 6,444,305 B2
(45) Date of Patent: *Sep. 3, 2002

(54) CONTACT PRINTABLE ADHESIVE COMPOSITION AND METHODS OF MAKING THEREOF

(75) Inventors: John P. Banovetz, Minneapolis; Spencer F. Silver, St. Paul; Joaquin Delgado, Tokyo, all of MN (US)

(73) Assignee: 3M Innovative Properties Company, St. Paul, MN (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/920,795

(22) Filed: Aug. 29, 1997

(51) Int. Cl.[7] .................................................. C09J 7/00
(52) U.S. Cl. .............................. 428/321.5; 428/355 AC; 525/193; 525/223; 525/226; 525/903
(58) Field of Search ........................ 428/321.5, 355 AC; 525/193, 223, 226, 903

(56) References Cited

U.S. PATENT DOCUMENTS

| | | | |
|---|---|---|---|
| 3,691,140 A | 9/1972 | Silver | 260/78.5 |
| 4,166,152 A | 8/1979 | Baker et al. | 428/722 |
| 4,181,752 A | 1/1980 | Martens et al. | 427/54.1 |
| 4,243,455 A | 1/1981 | Shiba et al. | 156/187 |
| 4,329,384 A | 5/1982 | Vesley et al. | 428/40 |
| 4,330,590 A | 5/1982 | Vesley | 428/336 |
| 4,379,201 A | 4/1983 | Heilmann et al. | 428/345 |
| 4,391,687 A | 7/1983 | Vesley | 204/159.16 |
| 4,415,615 A | 11/1983 | Esmay et al. | 428/40 |
| 4,495,318 A | 1/1985 | Howard | 524/375 |
| 4,554,324 A | 11/1985 | Husman et al. | 525/301 |
| 4,624,801 A * | 11/1986 | Kawaguchi et al. | 252/500 |
| 4,640,981 A | 2/1987 | Dery et al. | 174/88 R |
| 4,659,872 A | 4/1987 | Dery et al. | 174/117 A |
| 4,737,559 A | 4/1988 | Kellen et al. | 526/291 |
| 4,786,696 A | 11/1988 | Bohnel | 526/88 |
| 4,968,562 A | 11/1990 | Delgado | 428/402 |
| 4,988,467 A | 1/1991 | Holdsworth et al. | 264/46.6 |
| 5,045,569 A | 9/1991 | Delgado | 521/60 |
| 5,053,436 A | 10/1991 | Delgado | 521/64 |
| 5,122,215 A | 6/1992 | Shibata et al. | 156/250 |
| 5,141,989 A * | 8/1992 | Jung et al. | 524/561 |
| 5,202,361 A | 4/1993 | Zimmerman et al. | |
| 5,266,402 A * | 11/1993 | Delgado et al. | 428/355 |
| 5,508,313 A | 4/1996 | Delgado et al. | 521/63 |
| 5,571,617 A | 11/1996 | Cooprider et al. | 428/341 |

FOREIGN PATENT DOCUMENTS

| | | |
|---|---|---|
| EP | 0 433 871 A | 6/1991 |
| WO | 92 11334 A | 7/1992 |
| WO | WO 97/17380 | 5/1997 |

* cited by examiner

*Primary Examiner*—Cynthia H. Kelly
*Assistant Examiner*—Dawn Garrett
(74) *Attorney, Agent, or Firm*—Carolyn V. Peters (57) ABSTRACT

A contact printable adhesive composition comprises (a) swellable, elastomeric microspheres and (b) at least one polymerizable monomer or a mixture of polymerizable monomers capable of swelling the microspheres. As used in this application "contact printable adhesive composition" is a composition that can be used in a contact printing process and then cured. The cured contact printable adhesive composition will generally be referred to as "contact printed adhesive".

29 Claims, 1 Drawing Sheet

Fig. 1

Fig. 2

CONTACT PRINTABLE ADHESIVE COMPOSITION AND METHODS OF MAKING THEREOF

TECHNICAL FIELD

This invention relates to adhesives and adhesive compositions, particularly to adhesive compositions containing microspheres and more particularly to printable adhesive compositions containing microspheres and methods thereof.

BACKGROUND OF THE INVENTION

A variety of methods to deliver printable or patternable adhesives exist and offer several advantages over conventional flood coating. These advantages include selective placement of adhesive on the substrate that results in reduced waste and improved handling. Each printing method requires that the printable material that is used possess particular rheological characteristics.

The following table describes a range of viscosities and characteristics of printable material classified by printing method.

| Characteristics of Printing Material | | |
|---|---|---|
| Printing Method | Viscosity @ 25° C. (Pas)** | Description* |
| Lithography | 15–35 | Heavy or thick |
| Gravure | ~0.015 | Quite fluid |
| Flexography | ~0.015 | Relatively fluid |
| Screen | 2 | Short and buttery |

*Graphics Art Manual, Arno Press, Ed. Janet N. Field, pages 416–418, 492–496, 1980
**Printing Inks, Pira International, Ronald Todd, pages 296–297, 1994

Printing methods can be classified into two general fields, contact (impression) and non-contact (impactless) printing. Contact printing describes the processes in which an image is transferred through direct contact between the printing plate or image carrier and the substrate. Contact printing methods include lithography, gravure, flexography, and screen printing. In contrast, non-contact printing methods describe processes in which little or no contact is made with the substrate. Non-contact printing methods include electrophotography, thermal imaging, jet printing, and electrographic methods.

Screen-printing is a popular contact printing method due to the relative simplicity of both the printing process and equipment and the variety of surfaces that can be imprinted using this method. The screen printing process first involves making a stencil on a screen mesh that defines the pattern, text, image, etc. that is to be printed on a particular surface. Once the screen is prepared, a fluid (usually ink) is squeezed through the open areas of the stenciled mesh to transfer the pattern or image to this surface. As a final step, the fluid must be dried or otherwise fixed to prevent the distortion and preserve the integrity of the printed pattern or image.

Screen printing is unique among other printing methods as it can be used to deliver relatively thick fluid films, anywhere from 8 micrometers to over 30 micrometers in thickness. This thick coating capability renders screen printing an ideal method for coating discrete patterns of adhesives. Adhesive materials, particularly pressure sensitive adhesives, generally exhibit their desirable properties of high internal strength and clean removability from a adherend only if coated or printed at a sufficient thickness.

Screen printable fluids, including adhesives, must possess a particular balance of rheological properties that permits both sufficient fluid flow when squeezed through the screen mesh during the printing process and adequate resistance to flow to prevent smearing or soak through of the printed pattern. Such rheological characteristics can be expressed in terms of the viscosity and yield point of the printing fluid. Viscosity is generally defined as the printing fluid's relative resistance to continual shear or flow. When the viscosity of a screen printing fluid is too low, excessive flow following printing causes poor image resolution. On the other hand, a printing fluid having too high a viscosity flows unevenly through the screen, resulting in poor transfer of the image or pattern to the target surface.

The yield point represents the printing fluid's relative resistance to initial shear. Fluids having acceptable yield point for screen-printing possess high apparent viscosity when stationary, but readily flow when exposed to shear forces.

Part of the poor transfer of the image associated with high viscosity materials is due to "stringing" of the high viscosity materials. "Stringing" is the visible strands of material as the screen pulls away from the substrate. Some adhesive compositions, particularly pressure sensitive adhesive compositions, are prone to stringing, which makes them undesirable for screen-printing. Stringing can be reduced or eliminated by controlling the molecular weights of the polymers and prepolymers in the composition. However, elimination of high molecular weight polymers from the composition may limit adhesive performance.

Attempts to modify adhesive and other coatings to meet these rheological requirements for screen printability have taken several routes. Addition of solvents or other carrier liquids to coating formulations has traditionally been one means for adjusting rheology of coating formulations. Although effective in providing screen printable compositions, use of solvents has several undesirable drawbacks, including potential for screen clogging due to solvent volatility and the need to recover and dispose of the solvent after printing. When water-based printable compositions are used, similar water removal and disposal process steps and equipment are required. Such drying steps can also limit the use of types of surfaces or substrates: thermally sensitive surfaces or substrates must often be avoided.

Screen printable formulations that can be cured after printing by exposure to actinic or other radiation sources eliminate some of the processing difficulties and concerns associated with solvent- or water-based compositions. Using this method, a polymerizable mixture of monomers, initiators, crosslinkers and other reactive components is combined with other coating additives and this mixture is screen printed onto a surface. Once printed, the image or pattern is irradiated and cured using a radiation source such as electron beam, ultraviolet light or gamma radiation.

Several approaches have been described to obtain radiation curable formulations having the requisite rheological properties for screen-printing. Co-reactive oligomers or polymers, such as oligomers or polymers having one or more functional groups that can copolymerize with monomeric components, can be added to tailor the viscosity of the reactive mixture. Similarly, nonfunctional oligomers or polymers can also be added to the mixture. With both of these approaches, the compatibility of these co-reactive and nonfunctional additives with both the unreacted mixture and the cured product can be a critical consideration. Lack of compatibility of these oligomeric or polymeric rheological additives can result in cured products having compromised appearance and physical properties.

Attempts have also been made to provide suitable viscosities for screen printable adhesive formulations by partially polymerizing the reactive mixture. Once the partially polymerized mixture is printed, the image or pattern is then exposed to radiation to complete the polymerization and cure.

However, incorporation of polymeric materials of too high molecular weight, either by direct addition or partial polymerization of the reactive mixture, may cause "stringing". The weight average molecular weight of the polymers is typically below 1,000,000 and preferably below 600,000 to limit the elongation viscosity and result in less stringing of the adhesive during screen-printing. Limitation of molecular weight, however is not a complete solution, because such changes can diminish adhesive properties.

Addition of inorganic particulate fillers, such as silica, is another approach to controlling viscosity and yield point of radiation curable screen printable compositions. While providing suitable rheological characteristics, such inorganic particulate additives are difficult to evenly disperse in the coating and can lead to diminished weatherability and appearance of printed pattern or image. In addition, for adhesive applications, addition of silica or other inorganic particles can drastically influence the adhesive properties.

Swellable, elastomeric, acrylate or vinyl ester microspheres are typically the particulate suspension polymerization products of acrylate, methacrylate, and/or vinyl ester monomers and free radically polymerizable polar monomers. These polymerizations are performed in the presence of a variety of emulsifiers, surfactants, and stabilizers and/or under particular process conditions that induce the formation and prevent the agglomerations of the microspheres. Depending on the monomers used and processing additives or methods employed, these microspheres can be hollow (i.e., having at least one internal void or cavity) or solid (i.e., having no internal voids or cavities); tacky or tack-free; water or solvent dispersible; lightly or highly crosslinked; and a range of diameters (from about 0.5 to about 300 microns) and polymeric morphologies.

Such microspheres, particularly those having pressure-sensitive adhesive properties, are useful either when coated from aqueous suspensions or solvent dispersions in providing repositionable or removable adhesive coatings for a variety of articles and substrates. As screen printable adhesive coatings, these suspensions and dispersions suffer from the same drying and carrier liquid disposal drawbacks as the water- and solvent-borne printable coatings discussed above. Additionally, screen-printed adhesives coatings formed from such suspensions or dispersions could yield discontinuous coatings.

Microspheres have also been blended with film forming adhesive polymer matrix materials to form composites having a range of adhesive and other functional properties. Due to the typically high molecular weight and viscosity of these adhesive matrix materials, such blends of microspheres would possess unsuitable rheological properties that would result in uneven flow through the screen mesh and exhibit undesirable "stringing" when printed.

Microspheres have also been used as fillers in radiation curable high performance acrylic pressure-sensitive adhesive formulations. In such formulations, microspheres are combined with a free radically polymerizable monomer mixture. The mixture is then flood-coated onto a surface and, in an oxygen-free atmosphere, polymerized by exposure to heat or other radiation sources. The polymerized product is described as an interpenetrating pressure-sensitive adhesive polymer network wherein the polymerized monomer mixture forms an interpenetrating polymer network within the boundaries of the microspheres.

SUMMARY OF THE INVENTION

Briefly, in one aspect of the present invention, a contact printable adhesive composition is provided comprising (a) swellable, elastomeric microspheres and (b) at least one polymerizable monomer or a mixture of polymerizable monomers capable of swelling the microspheres. As used in this application "contact printable adhesive composition" is a composition that can be used in a contact printing process and then cured. The cured contact printable adhesive composition, that is, the polymerization product of component (a) and (b) above, will generally be referred to as "contact printed adhesive".

It has been discovered that swellable, elastomeric microspheres can be used as rheological modifiers to create contact printable adhesive compositions.

When the microspheres are combined with polymerizable monomer mixtures to provide compositions having the proper viscosity and yield point, these contact printable adhesive compositions flow sufficiently to provide a fairly smooth surface in a short amount of time after screen printing. Compositions are selected to provide a yield point that is high enough to maintain printing resolution after printing onto a substrate and/or provide sufficient adhesive thickness.

Optionally, viscosity modifiers such as thermoplastic polymers and copolymers, semi-crystalline polymers, and macromers may be added to the contact printable adhesive composition to modify the viscosity of and to alter adhesive performance.

In yet another embodiment, functional inorganic particles may be added to the contact printable adhesive composition. For example, an electrically conductive contact printable adhesive composition can be prepared by adding electrically conductive materials to the contact printable adhesive composition. In this application, the present invention also offers the further advantage of concentrating the conductive particles interjacent to the swollen microspheres. Fewer conductive particles are required when compared to non-microsphere containing conductive adhesive compositions because the microsphere domains take up a large amount of the space in the composition.

Another example of functional inorganic particles is the addition of luminescent particles. A luminescent contact printable adhesive composition can be prepared by adding luminescent particles to the contact printable adhesive composition.

In another embodiment, a method of using the contact printable adhesive composition is provided comprising the steps of: (a) providing a contact printable adhesive composition comprising: (i) swellable, elastomeric microspheres and (ii) at least one polymerizable monomer or a mixture of polymerizable monomers capable of swelling the microspheres, (b) applying the contact printable adhesive composition to a substrate using a suitable contact printing process.

This invention describes adhesive compositions that are applicable to contact printing methods. Examples of contact printing methods include lithography, gravure, flexography, and screen printing methods. Such printing methods can be used to provide adhesive-coated articles wherein the adhesive is actually printed on at least one major surface of a substrate. Such articles can include tape, flags, notes, sheets, signage, flexible circuits, or any another article than can be manufactured using conventional flood coating techniques. Uniquely, printable adhesives may provide an advantage in situations wherein flood coating may be an inappropriate "coating" method for an adhesive.

Surprisingly, such compositions possess a non-Newtonian rheological character that particularly suits screen printing equipment and processes. These microsphere-containing compositions and processes are substantially solvent free in nature and resist stringing and screen mesh clogging. While the adhesive compositions of the present invention are uniquely useful for contact printing, they may also be used in flood coating processes, although it is known that flood coatable adhesives are not necessarily useful as contact printable adhesives.

In a more preferred embodiment, the present invention provides a contact printable adhesive composition comprising: (a) about 2.5 to about 15% by weight, preferably about 5 to about 10% by weight, of swellable, elastomeric acrylate or vinyl ester microspheres; and (b) about 85 to about 97.5% by weight, preferably about 90 to about 95% by weight, of at least one polymerizable monomer or a mixture of polymerizable monomers capable of swelling the microspheres. The composition is substantially solvent-free and exhibits non-Newtonian rheological behavior and acts as a pseudoplastic. Compositions of the present invention have viscosity in the range of about 1 Pascal-second (Pas) to about 1000 Pascal-second at a shear rate of 1 $sec^{-1}$ and a viscosity range of about 1 Pascal-second to about 100 Pascal-second at a shear rate of 100 $sec^{-1}$ and a yield point of about 0.25 Pascal (P) to about 1000 Pascal.

Swellable, elastomeric microspheres useful in the present invention are preferably acrylate-based, pressure sensitive adhesive microspheres prepared by suspension polymerization processes. They may be solid, hollow or a mixture and have a volume average diameter of about 0.5 micrometers to about 300 micrometers, preferably about 1 to about 100 micrometers.

Polymerizable monomers and mixtures of such monomers useful in the present invention must be capable of swelling the swellable, elastomeric microspheres and can be selected with regard to the desired properties of the cured contact printed adhesive material. Depending on the components of the polymerizable monomer or resin mixture, contact printable coatings of the present invention exhibit either pressure-sensitive adhesive properties or heat-activatable adhesive properties.

For example, if pressure-sensitive adhesive contact printable formulations are desired, then polymerizable monomer mixtures comprising alkyl acrylate esters and monoethylenically unsaturated reinforcing comonomers wherein the polymerization product of the monomers and comonomers has a glass transition temperature of less than about –15° C. are preferred. Heat-activatable adhesive contact printable compositions can be prepared from the same alkyl acrylate esters and higher proportions of monoethylenically unsaturated reinforcing monomers. The glass transition temperatures of such heat-activatable adhesive compositions are typically greater than 0° C., although such temperatures could be less than 0° C.

In this application:

"swellable" means a crosslinked polymeric material that swells in a reactive monomer mixture to an extent larger than its original dimension and forms a dispersion, substantially of individual particles;

"elastomeric" means amorphous or noncrystalline materials that can be stretched to at least twice their original length and that will retract rapidly to substantially (generally at least about 75% of, preferably, at least about 90% of) their original dimensions upon release of the force;

"substantially solvent free" means a composition that has been prepared without the use of large amounts of solvent, that is, less than 5 percent by weight of the screen printable composition, preferably less than about 2 percent, and more preferably no additional solvent at all;

"solvent" means conventional organic solvents generally used in the industry which include, for example, toluene, heptane, ethyl acetate, methyl ethyl ketone, acetone, and mixtures thereof;

"pressure-sensitive adhesive" means an adhesive material that is aggressively tacky at room temperature and firmly adheres to a variety of dissimilar surfaces upon mere contact without the need of more than finger pressure, yet has a sufficiently cohesive and elastic nature so that, despite its aggressive tackiness, it can be handled with the fingers and removed from smooth surfaces without leaving a residue (Pressure-Sensitive Tape Council Test Methods, 1985, p. 5);

"heat-activatable adhesive" means an adhesive material that firmly adheres upon application of heat or of pressure or both.

DESCRIPTION OF THE PREFERRED EMBODIMENT(S)

It has been discovered that swellable, elastomeric microspheres can be used as rheological modifiers to create contact printable adhesive compositions. When the microspheres are combined with polymerizable monomer mixtures to provide compositions having the proper viscosity and yield point, these contact printable adhesive compositions flow sufficiently to provide a fairly smooth surface in a short amount of time, after contact printing. Compositions are selected to provide a yield point that is high enough to maintain printing resolution after printing onto a substrate.

A contact printable adhesive composition is provided comprising (a) swellable, elastomeric microspheres and (b) at least one polymerizable monomer or a mixture of polymerizable monomers capable of swelling the microspheres.

While not intending to be bound by theory, rheological properties of these contact printable adhesive compositions of the present invention appear to rely on swelling of the elastomeric particles by the monomer mixture. A significant increase in viscosity for the material appears to be due to hindered flow of the swollen particles. Upon application of shear forces, the particles deform and flow past each other. Upon removal of the shear forces, the particles, because of their crosslinked nature, return to their original shape with a concurrent increase in viscosity.

Swellable, Elastomeric Microspheres

Swellable, elastomeric microspheres of the contact printable adhesive compositions of the present invention can be prepared by suspension, dispersion, direct emulsion and modified emulsion techniques. Preferably, the swellable, elastomeric microspheres are prepared according to the suspension polymerization methods described in, for example, U.S. Pat. Nos. 3,691,140; 4,166,152; 4,495,318; 4,786,696; 4,988,467; 5,045,569; 5,508,313; and 5,571,617, the disclosures of which are incorporated herein by reference. The preferred swellable, elastomeric microspheres are acrylate or vinyl ester microspheres.

In preferred suspension polymerization methods, the swellable, elastomeric acrylate or vinyl ester microspheres can typically be prepared by forming an oil phase comprising (meth)acrylic acid ester and/or vinyl ester monomers, optionally also containing free radically polymerizable polar comonomers, and an oil soluble free radical initiator in an water phase that comprises an aqueous medium having at least one suspension stabilizer or surfactant. Depending on the types and amounts of monomers, comonomers, crosslinking agents, stabilizers, surfactants, reaction conditions, and other composition and process alternatives employed, these microspheres can be hollow (i.e., having at least one internal void or cavity) or solid (i.e., having no internal voids or cavities); tacky or tack-free; water or solvent dispersible; lightly or highly crosslinked; and a range of diameters (from about 0.5 to about 300 microns) and polymeric morphologies.

(Meth)acrylic acid ester monomers used in the swellable, elastomeric acrylate microspheres are monofunctional unsaturated (meth)acrylate esters of non-tertiary alkyl alcohols. The alkyl groups of these alcohols preferably contain from 4 to 14 (more preferably 4 to 10) carbon atoms. Examples of useful monomers include sec-butyl acrylate, n-butyl acrylate, isoamyl acrylate, 2-methylbutyl acrylate, 4-methyl-2-pentyl acrylate, 2-ethylhexyl acrylate, isooctyl acrylate, isononyl acrylate, isodecyl methacrylate, isodecyl acrylate, dodecyl acrylate, tetradecyl acrylate, and mixtures thereof. Particularly preferred are n-butyl acrylate, sec-butyl acrylate, isoamyl acrylate, 2-ethylhexyl acrylate, isooctyl acrylate, isononyl acrylate, isodecyl acrylate, and mixtures thereof. Of these, isooctyl acrylate and 2-ethylhexyl acrylate are the most preferred.

Vinyl ester monomers useful for providing the swellable, elastomeric vinyl ester microspheres are unsaturated vinyl esters derived from linear or branched carboxylic acids having 1 to 14 (preferably 7 to 12) carbon atoms (not counting the carboxyl carbon atom). Suitable vinyl ester monomers include vinyl propionate, vinyl pelargonate, vinyl hexanoate, vinyl caprate, vinyl 2-ethylhexanoate, vinyl octanoate, vinyl decanoate, vinyl laurate, and mixtures thereof. Particularly preferred are vinyl caprate, vinyl 2-ethylhexanoate, vinyl laurate, and mixtures thereof.

(Meth)acrylate ester or other vinyl monomers which, as homopolymers, have glass transition temperatures higher than about −20 to 0° C., e.g., ethyl acrylate, tert-butyl acrylate, isobornyl acrylate, butyl methacrylate, vinyl acetate, acrylonitrile, mixtures thereof, and the like, may be used in conjunction with one or more of the (meth)acrylate and vinyl ester monomers provided that the glass transition temperature of the resulting microspheres are below about −0° C.

Swellable, elastomeric acrylate or vinyl ester microspheres useful in the present invention further comprise a free radically polymerizable polar comonomer copolymerizable with the (meth)acrylic acid ester or vinyl ester monomer. The free radically polymerizable polar comonomers may be added to improve or modify cohesive strength, storage stability, adhesion to polar surfaces, and glass transition temperature of the microspheres. It is preferred that the polar monomer be incorporated in an amount of no more than about 1 to 20 parts by weight.

In addition to their copolymerizability with the (meth)acrylic acid ester or vinyl ester monomer, the free radically polymerizable polar comonomers are monomers that are both oil and water soluble and include one of the following polar substituents: amide, nitrile, hydroxyl and carboxylic acid (including acid salt) groups. Suitable polar monomers include monoolefinic monocarboxylic acids, monoolefinic dicarboxylic acids, salts thereof, acrylamides, N-substituted acrylamides, N-vinyl lactams, and mixtures thereof. Representative examples of these classes of useful polar monomers include acrylic acid, methacrylic acid, itaconic acid, crotonic acid, maleic acid, fumaric acid, sulfoethyl methacrylate, N-vinyl pyrrolidone, N-vinyl caprolactam, acrylamide, t-butyl acrylamide, dimethylamino ethyl acrylamide, N-octyl acrylamide, hydroxy ethyl acrylate, and hydroxy ethyl methacrylate. Ionic monomers such as sodium methacrylate, ammonium acrylate, sodium acrylate, trimethylamine p-vinyl benzimide, N,N-dimethyl-N-(beta-methoxy-ethyl) ammonium propionate betaine, trimethylamine methacrylamide, 1,1-dimethyl-1-(2,3-dihydroxypropyl)amine methacrylamide, and mixtures thereof are also useful. Particularly preferred are acrylic acid, sodium acrylate, N-vinyl pyrrolidone, and mixtures thereof.

The swellable, elastomeric microspheres useful in the invention may also contain a multifunctional free-radically polymerizable crosslinking agent. Such crosslinking agents can enhance the cohesive strength and solvent insolubility of the individual microspheres by internally crosslinking them. "Multifunctional" refers to crosslinking agents that possess two or more free-radically polymerizable olefinically unsaturated groups. Useful multifunctional crosslinking agents include (meth)acrylic esters of diols (e.g., butanediol), triols (e.g., glycerol), and tetrols (e.g., pentaerythritol); polymeric multifunctional (meth)acrylates (e.g., poly(ethylene oxide) diacrylate and poly(ethylene oxide) dimethacrylate); polyvinylic compounds (e.g., substituted and unsubstituted divinylbenzene); difunctional urethane acrylates; and mixtures thereof.

When a crosslinking agent is employed, it is typically used at a level of up to about 0.15 equivalent weight percent. Above about 0.15 equivalent weight percent, the microspheres tend to lose their pressure sensitive adhesive qualities and eventually become non-tacky to the touch at room temperature. Non-tacky and tacky microspheres are useful in this invention. However, crosslinking level effects particle swellability; the higher the crosslinking, the lower the particle swelling. To ensure high particle swelling and achieve the desired rheological properties at low particle loadings, low levels of crosslinker agent are desired.

The "equivalent weight percent" of a given compound is defined as the number of equivalents of that compound divided by the total number of equivalents of free-radically polymerizable unsaturation in the total microsphere composition. An equivalent is the number of grams divided by the equivalent weight. The equivalent weight is defined as the molecular weight divided by the number of polymerizable groups in the monomer (in the case of those monomers with only one polymerizable group, equivalent weight=molecular weight).

Crosslinking may also be controlled with the use of chain transfer agents. Useful chain transfer agents are those which are normally suitable for free radical polymerization of acrylates. The chain transfer agents useful in the practice of the invention include, but are not limited to, carbon tetrabromide, n-dodecyl mercaptan, isooctylthiolglycolate, and mixtures thereof. If used, the chain transfer agent(s) are present in the amounts from 0.01 to 1 percent by weight of the total polymerizable composition.

Useful oil soluble free-radical initiators are those which are normally suitable for free radical polymerization of acrylate or vinyl ester monomers and which are oil soluble and of very low solubility in water, typically less than 1 g/100 g water at 20° C. Examples of such initiators include azo compounds, hydroperoxides, peroxides, and the like, and photoinitiators such as benzophenone, benzoin ethyl ether, 2,2-dimethoxy-2-phenyl acetophenone. The initiator is generally used in an amount ranging from about 0.01 percent up to about 10 percent by weight of the total polymerizable composition, preferably up to about 5 percent.

Use of a substantially water soluble polymerization initiator, such as those generally used in emulsion polymerizations, causes formation of substantial amounts of latex. During suspension polymerization, any significant formation of latex is undesirable because of the extremely small particle size.

The swellable, elastomeric acrylate or vinyl ester microspheres tend to be bead or pearl shaped, although they may be more spheroidal. Typically, they have a volume average diameter of about 0.5 to 300 microns (more preferably, about 1 to 100 microns) before swelling. The microspheres may be solid, hollow or a mixture thereof. Hollow microspheres contain one or more voids; i.e., one or more spaces completely within the walls of a polymerized microsphere. Typically, the hollow portion is less than 100 microns in average diameter.

If hollow microspheres are desired they may be obtained either via a "two-step" process as described in U.S. Pat. No. 4,968,562 or a "one step" process as described in U.S. Pat. No. 5,053,436.

Solid pressure sensitive adhesive microspheres may be prepared via the suspension polymerization techniques that use ionic or nonionic emulsifiers in an amount sufficient to generate the necessary particle and is generally near the critical micelle concentration and/or protective colloids, finely divided inorganic solids, or the like.

Each suspension polymerization method (whether producing hollow or solid microspheres) may be modified by withholding the addition of all or some of the free-radically polymerizable polar comonomer until after polymerization of the oil phase (meth)acrylic acid ester or vinyl ester monomer has been initiated. In this instance, however, these components must be added to the polymerizing mixture before 100% conversion of the (meth)acrylic acid ester or vinyl ester monomer. Similarly, a multifunctional free-radically polymerizable crosslinking agent (if used) can be added at any time before 100% conversion to polymer of the monomers of the microsphere composition. Preferably, the crosslinking agent is added before initiation occurs.

Polymerizable Mixtures

The polymerizable mixtures of the present invention are prepared from adhesive compositions comprising from about 25 to 100 parts by weight of at least one polymerizable monomer, preferably at least one alkyl acrylate monomer, and correspondingly, from about 75 to 0 parts by weight of a reinforcing comonomer.

Alkyl acrylate monomers useful in the polymerizable monomer mixtures of the present invention are those which have a homopolymer glass transition temperature less than about 100° C. Useful alkyl acrylates are unsaturated monofunctional (meth)acrylic acid esters of non-tertiary alkyl alcohols having from 2 to 20 carbon atoms in the alkyl moiety, and preferably from 4 to 18 carbon atoms. Examples of useful alkyl acrylate monomers include, but are not limited to, n-butyl acrylate, hexyl acrylate, octyl acrylate, isooctyl acrylate, 2-ethylhexyl acrylate, isononyl acrylate, decyl acrylate, isoborny acrylate, lauryl acrylate, octadecyl acrylate, and mixtures thereof.

A monoethylenically unsaturated comonomer having a homopolymer glass transition temperature greater than about 25° C. is preferably copolymerized with the acrylate monomers in the screen-printable adhesives of the invention. Examples of useful copolymerizable monomers include, but are not limited to, (meth)acrylic acid, N-vinyl pyrrolidone, N-vinyl caprolactam, substituted (meth) acrylamides, such as N,N,-dimethyl acrylamides, acrylonitrile, N-vinyl formamide, and mixtures thereof. When a copolymerizable monomer is used, the alkyl acrylate is present in the screen-printable composition in amounts from about 25 to 99 parts by weight and the copolymerizable monomer is present in corresponding amounts from 75 to 1 parts by weight wherein the total amount by weight is 100.

The amounts and types of comonomer can be varied to provide pressure-sensitive or heat-activatable properties as desired for the end use. Larger amounts of comonomer will result in less tack and are suitable as heat-activatable adhesives while lower amounts are more suitable for pressure-sensitive adhesives. The type of comonomer can also be varied to obtain desired properties. Reinforcing comonomers, that is, those that have hydrogen-bonding moieties, such as acrylic acid are useful in amounts from about 1 to about 15 parts by weight for pressure-sensitive screen-printable adhesives. Amounts above about 15 parts are useful as heat-activatable screen-printable adhesives. Comonomers such as N-vinyl caprolactam, N-vinyl pyrrolidone, and isobornyl acrylate provide pressure-sensitive properties to a screen-printable adhesive up to about 40 parts by weight, while amounts above about 40 parts will provide heat-activatable screen-printable adhesives.

Another class of monomers, useful as polymerizable monomer mixtures in the present invention are α-olefin monomers that have a homopolymer glass transition temperature less than about 0° C. Such useful monomers include unsaturated hydrocarbons containing 4–15 carbons with a terminal site of unsaturation. Examples include 1-hexene, 1-octene, 1-decene, and 1-dodecene.

The contact printable adhesive composition of the present invention comprises: (a) about 2.5 to about 15% by weight, preferably about 5 to about 10% by weight, of swellable, elastomeric acrylate or vinyl ester microspheres; and (b) about 85 to about 97.5% by weight, preferably about 90 to about 95% by weight, of at least one polymerizable monomer or a mixture of polymerizable monomers. As used in relation to the level of microspheres in the present invention, "% by weight" refers to the dry weight of microspheres present. Generally, when less than about 2.5% by weight of the microspheres is present, then the microspheres occupy insufficient volume to significantly increase viscosity and produce a measurable yield point. On the other hand, when greater than 15% by weight of swellable, elastomeric microspheres is used, then all the polymerizable liquid is swelled into the microspheres and grainy or adhesive crumb remains. This results in insufficient flow of the composition for contact printing.

Adhesive performance and viscosity can also be adjusted by adding a thermoplastic polymer or copolymer of appropriate molecular weight, or macromer to the polymerizable mixture of the above described contact printable adhesive compositions. Preferably, the polymer, copolymer, or macromer has a weight average molecular weight of less than about 100,000. Useful thermoplastic polymers include acrylic polymers such as poly(iso-butylmethacrylate) such as ELVACITE™ 2045 (commercially available from ICI Americas). Useful copolymers include block copolymers such as styrene butadiene copolymers and acrylic copolymers. Useful macromers are those that are copolymerizable with the acrylate monomers and are described in U.S. Pat. No. 4,554,324, incorporated herein by reference and are commercially available from ICI Americas (under the tradename of ELVACITE™ 1010). The thermoplastic polymers used in the composition in amounts of about 0–50 weight percent and preferably, 5–30 weight percent.

Additionally, the contact printable adhesive composition also includes a thixotropic agent, if required, such as silica to impart supplemental thixotropy to the composition. The viscosity of a thixotropic composition decreases when it is subjected to shear stresses so that it flows when it is screen printed. Once the shear stress is removed, the thixotropic material increases rapidly in viscosity so that the printed adhesive essentially does not flow once it has been printed onto a substrate. A suitable silica is commercially available under the CAB-O-SIL™ trade name (such as M-5 and TS-720 commercially available from Cabot Corporation) and AEROSIL™ 972 Silica (commercially available from DeGussa Corporation).

In another embodiment, the contact printable adhesive composition also includes electrically conductive materials. Such materials include, but are not limited to, metal particles and spheres such as aluminum, nickel, gold, copper, or silver, and coated copper, nickel, polymeric and glass spheres and particles coated with conductive coatings such as aluminum, gold, silver, copper, or nickel. Also useful are solder particles such as lead/tin alloys in varying amounts of each metal (commercially available from Sherritt Gordon Limited, Canada). Examples of commercially available electrically conductive particles include conductive nickel spheres (commercially available from Novamet, Inc., Wykoff, N.J.). Electrically conductive materials are also available from Japan Chemicals, Inc., Japan; Potters Industries Inc., Parsippany, N.Y.; and Sherritt Gordon Limited, Canada.

The amount of electrically conductive materials used in the contact printable adhesive compositions of the invention depends upon the type of substrate to be bonded and its end use. For example, for interconnecting a flexible circuit to a circuit board or to a liquid crystal display (LCD) where anisotropic or "z" axis electrical conductivity is required, the contact printable adhesive composition contains from 1 to 20, and preferably, from 1 to 10 percent of electrically conductive materials by volume of the composition. In bonding for shielding or grounding applications, for example, grounding a printed circuit board to a heat sink, or for electromagnetic interference (EMI) shielding, the screen-printable adhesive composition contains from 1 to 80, and preferably, from 1 to 70 percent electrically conductive material by volume of the adhesive composition.

In another preferred embodiment, the contact printable adhesive composition also includes luminescent particles. Such materials include, but are not limited to, metal oxide particles and spheres such as doped lanthanide oxides such as yttrium oxide doped with europium, or doped metal sulfides such as zinc sulfide. Further examples include, polymeric and glass spheres and particles coated or encapsulating luminescent materials. Examples of commercially available luminescent particles include europium doped yttrium oxide from Westlake Rare Earth Industries of San Mateo Calif., or zinc oxide/zinc phosphor available from Nichia America Corporation, Lancaster Pa.

The contact printable adhesive compositions of the invention also preferably include initiators. The free radical initiators used when the polymerizable monomer mixture comprises alkyl acrylate monomers and monoethylenically unsaturated reinforcing comonomers are known in the art and are preferably light activated. In a preferred embodiment, the initiator is a photoinitiator and examples include, but are not limited to, substituted acetophenones, such as 2,2-dimethoxy-2-2-phenylacetophenone, benzoin ethers such as benzoin methyl ether, substituted benzoin ethers such as anisoin methyl ether, substituted alpha-ketols such as 2-methyl-2-hydroxypropiophenone, phosphine oxides, and polymeric photoinitiators. Photoinitiators are commercially available from sources such as Ciba Geigy Corp. under the IRGACURE™ trade designation, such as IRGACURE™ 184, IRGACURE™ 651, IRGACURE™ 369, IRGACURE™ 907, under the ESCACURE™ trade name from Sartomer, and under the LUCIRIN™ TPO trade name from BASF.

The free radical photoinitiators can be used in amounts from about 0.001 pph to about 5 pph depending upon the type and molecular weight of the photoinitiator. Generally, lower molecular weight materials are used in amounts of about 0.001 pph to about 2 pph, while higher molecular weight polymeric photoinitiators are used in amounts from about 0.1 pph to about 5 pph.

The initiators used when the polymerizable monomer mixture is unsaturated hydrocarbons are catalysts capable of polymerizing alpha-olefins in the presence of acrylates. Preferably, organometallic catalysts based on palladium are used. Specifically, these catalysts are cationic palladium complexes with diimine ligands. These catalysts are described in WO 97/17380 and such description is incorporated herein by reference.

Crosslinking agents can be added to the contact printable adhesive compositions to improve the cohesive strength of the adhesive. Useful crosslinking agents include multifunctional acrylates, such as those disclosed in U.S. Pat. No. 4,379,201, which include but are not limited to 1,6-hexanediol diacrylate, trimethylolpropane triacrylate, 1,2-ethylene glycol diacrylate, pentaerythritol tetracrylate, and mixtures thereof, copolymerizable aromatic ketone comonomers such as those disclosed in U.S. Pat. No. 4,737,559, photoactive triazines such as those disclosed in U. S. Pat. Nos. 4,329,384, 4,330,590, and 4,391,687, organosilanes, benzophenones, and isocyanates. Thermally activated organic peroxides, such as di-t-butyl peroxides, can also be used for crosslinking by heat. Other useful crosslinking agents include urethane and epoxy diacrylate oligomers available under trademarks EBECRYL™ 230, EBECRYL™ 3605, and EBECRYL™ 8804 from UCB Radcure Inc., Smyrna, Ga., and CN 104™ from Sartomer Co., Exton, Pa.

Crosslinking agents are included in amounts from about 0.002 pph (parts per 100 parts of acrylate monomers, that is, the alkyl acrylate and the optional reinforcing polar comonomer) to about 2 pph, and preferably from about 0.01 pph to about 0.5 pph. The amount used will depend upon the amount of functionality and molecular weight of the crosslinking agent, and the desired properties of the adhesive. For electrically conductive screen-printable adhesives, it is preferred that the amounts of crosslinking agents and the chain transfer agents are balanced so that the adhesive flows sufficiently during bonding so that the conductive particles can come into contact with each other or with the conductive portion of the substrates to provide conductive pathways; yet the adhesive maintains sufficient strength to provide sufficient adhesive properties.

Crosslinking may also be controlled with the use of chain transfer agents. Useful chain transfer agents are those which are normally suitable for free radical polymerization of acrylates. The chain transfer agents useful in the practice of the invention include, but are not limited to, carbon tetrabromide, n-dodecyl mercaptan, isooctylthiolglycolate, and mixtures thereof. If used, the chain transfer agent(s) are present in the amounts from 0.01 to 1 percent by weight of the total polymerizable composition.

Tackifying agents can also be added to the dispersions of the contact printable compositions to enhance adhesion to certain low energy surfaces such as those on olefinic substrates. Useful tackifying agents include hydrogenated hydrocarbon resins, phenol modified terpenes, poly(t-butyl styrene), rosin esters, vinyl cyclohexane, and the like. Suitable tackifying resins are commercially available and include, for example, those sold under the REGALREZ™ and FORAL™ trade designations from Hercules, such as REGALREZ™ 1085, REGALREZ™ 1094, REGALREZ™ 6108, REGALREZ™ 3102, and FORAL™ 85.

When used, tackifying agents can be used in amounts from about 1 to about 100 pph, preferably 2 to 60 pph, and more preferably, 3 to 50 pph.

Other adjuvants can be included in the contact printable adhesive compositions in amounts needed to effect the desired properties as long as they do not affect the polymerization and the desired end properties. Furthermore, such adjuvants may be added to the swellable, elastomeric microspheres during polymerization before mixing. Useful adjuvants include dyes, pigments, fillers, coupling agents, and thermally conductive materials.

The contact printable adhesive compositions of the invention are preferably made by mixing the microspheres into the polymerizable monomer mixture and then adding the initiator. The polymerizable monomer solution may already contain crosslinking agent, tackifying resin, chain transfer agent, polymeric material. Optional solvent or other additives such as inorganic particles may also be incorporated into the dispersion.

The contact printable adhesives compositions are useful in the preparation of adhesive coated articles, such as tapes and sheets. Tapes typically have narrow widths in comparison to length. Sheets typically have substantially equal lengths and widths and may generally be prepared in the same manner as tapes. The tapes can be prepared as transfer tapes in which the screen printable adhesive is typically provided on a liner coated on both sides with a release coating. The tapes can also be prepared by having the adhesive permanently adhered to the backing. Tapes with the adhesive permanently adhered to the backing can be prepared either by laminating the adhesive of a transfer tape to the backing, or by printing the composition onto the backing and curing the adhesive on the backing. Tapes can also be double coated tapes wherein both sides of the backing have a layer of adhesive on them. Useful backing materials include polymeric films, such as those made from cast and oriented polyesters, cast and oriented polypropylene, polyethylene, paper, metal foils, woven and nonwoven fabrics, and foams, such as those made from polyolefins and acrylics. Examples of suitable acrylic foams are those disclosed in U.S. Pat. No. 4,415,615. Suitable polyolefin foams include crosslinked polyethylene and polyethylene/EVA foams.

The contact printable adhesive compositions of the present invention are particularly useful for screen printing directly onto a substrate when it is desired to have adhesive only on select areas of the surface. One such substrate is a flexible electrical circuit. Flexible electrical circuits generally comprise a polymeric film coated with electrically conductive metals such as copper, which has been etched to provide electrically conductive circuit traces. The polymeric films are typically polyimide, although other types of films such as polyester are also used. Suitable flexible circuits are commercially available from such sources as Minnesota Mining and Manufacturing Company, St. Paul, Minn. and Nippon Graphite, Ltd. Flexible circuits are also described in U.S. Pat. Nos. 4,640,981, 4,659,872, 4,243,455, and 5,122, 215. For these types of applications, preferred screen-printable compositions for the adhesives comprise from about 25 to 99 parts alkyl acrylate monomers and 75 to 1 parts of at least one reinforcing monomer that does not contain acid, and 1 percent to 10 percent by volume of electrically conductive particles. Preferably, the comonomer is isoborny acrylate and the electrically conductive particles are present in amounts of about 1 percent to 5 percent by volume.

Flexible electrical circuits are used in electronic devices where an electrical interconnection must be made, such as between two circuit boards, or between a circuit board and a liquid crystal display (LCD). Such connectors are useful in a variety of electronics such as in calculators, computers, pagers, cellular telephones, and the like.

The objects, features, and advantages of the present invention are further illustrated by the following examples, but the particular materials and amounts thereof recited in these examples, as well as other conditions and details, should not be construed to unduly limit this invention. All materials are commercially available, for example from Aldrich Chemicals and known to those skilled in the art unless otherwise stated or apparent. In the examples, all parts and percentages are by weight, unless otherwise indicated. All molecular weights reported are number average molecular weights in grams/mol.

EXAMPLES

Test Methods

Yield Stress

This test is a measurement of the flow properties of viscous fluids. The yield stress was determined with a Bohlin CS-50 Rheometer in a cone and plate geometry or a cup and bob geometry for samples with low yield stress values. The gap was 150 microns. The material flows under the influence of applied stress and the rotational speed of the bob is measured to calculate the shear rate. By choosing appropriate upper and lower limits for the shear stress sweep, information about the yield stress is determined.

Shear Viscosity

The shear viscosity of the dispersions was determined with a Bohlin VOR Rheometer in a cone and plate geometry, or with a Bohlin CS Rheometer in a cup and bob geometry. The gap was set at 150 microns with either experimental arrangement. For the Bohlin VOR Rheometer, the material is subjected to applied strain by moving the plate at a certain speed. The stress exerted by the material on the upper cone is then measured. By choosing appropriate upper and lower limits for the shear stress sweep, information about the shear viscosity is determined. With the Bohlin CS Rheometer, the material is subjected to a controlled stress and the rotational speed of the bob is measured to calculate the shear rate and viscosity of the sample.

Electrical Conductivity

This test measures the electrical resistance through the adhesive bond and a conducting circuit. A test sample is prepared by bonding a straight line 153 micron (8 mil) pitch adhesive coated flexible circuit (3M Brand Heat Seal Connector without adhesive available from Minnesota Mining and Manufacturing Co. St. Paul Minn.) between a printed circuit board (FR-4 test board) and an ITO coated glass plate (20 ohms/square sheet resistivity available from Nippon Sheet Glass, Japan). The circuit traces of the flexible circuit are aligned to the corresponding traces on the circuit board and bonded by hand pressure for a pressure sensitive adhesive or by hot bar bonded for a heat activated adhesive. Hot bar bonding is accomplished with a 3 mm by 25.4 mm thermode (TCW 125, from Hughes Aircraft) set at 145° C. and 54.4 atm or 15 seconds. The other end of the flexible circuit is bonded to the ITO coated glass plate. Electrical resistance of the adhesive interconnection is measured by the four wire method using the principles described in ASTM B 539-90 such that the net resistance not due to the interconnection is minimized to approximately 150 milliOhms.

90° Peel Adhesion

This test is conducted by adhering a flexible circuit with the adhesive to either an FR-4 circuit board or to an indium tin oxide glass plate (20 ohms/square sheet resistivity available from Nippon Sheet Glass, Japan) by bonding by hand pressure for a pressure sensitive adhesive or by hot bar bonding for a heat activated adhesive. Hot bar bonding is accomplished with a 3 mm by 25.4 mm thermode (TCW 125, from Hughes Aircraft) set at 145° C. and 54.4 atm or 15 seconds. The circuit board is mounted in a fixture in the lower jaw of an Instron™ Tensile Tester so that the flexible circuit, mounted in the upper jaw, would be pulled at a 90° angle. The width of the flexible circuit is 1.9 to 2.5 cm. The jaw separation speed was 2.54 millimeters per minute and the results are recorded in grams/centimeter.

| Glossary | |
|---|---|
| 2691A | core/shell polymeric particle available from Rohm and Haas Company. Particle consists of a styrene/butadiene core with a poly(methyl-methacrylate) shell. |
| AA | acrylic acid |
| AC3355 | core/shell polymeric particle available from Takeda Chemical Company. Particle size is 0.5 microns. Particle consists of crosslinked butylacrylate/ethylacrylate core with a poly(methylmethacrylate) shell. |
| AmA | ammonium acrylate |
| BA | n-butyl acrylate |
| BDA | 1,4 butanedioldiacrylate |
| EBECRYL ™ 230 | urethane diacrylate oligomer crosslinking agent available from UCB Radcure Inc. |
| ELVACITE ™ 2045 | poly(isobutylmethacrylate) thermoplastic polymer available from ICI Americas |
| HDDA | 1,6 hexanedioldiacrylate |
| IBOA | isobornyl acrylate |
| IOA | isooctyl acrylate |
| i-Pr | Isopropyl |
| IRGACURE ™ 651 | 2,2-dimethoxy-2-phenyl acetophenone photoinitiator commercially available from Ciba-Geigy |

-continued

| Glossary | |
|---|---|
| KM330 | core/shell polymeric particle available from Rohm and Haas Company. Material consists of an acrylic core with a poly(methylmethacylate) shell. |
| K-resin | poly(styrene-co-butadiene) thermoplastic copolymer available from Phillips Petroleum |
| LUCIRIN ™ TPO | diphenyl (2,4,6-trimethylbenzoyl) phosphine oxide photoinitiator commercially available from BASF. |
| MMA | methyl methacrylate |
| MSA | microsphere adhesive |
| Pas | Pascal-second |
| Poly(IOA) | poly(isooctylacrylate) prepared by solution polymerization according to standard synthetic procedures. |
| PSA | pressure sensitive adhesive |
| REGALREZ ™ 1094 | hydrocarbon resin tackifier commercially available Hercules |
| $Y_2O_3$/Eu | europium-doped yttrium oxide phosphor commercially available from Westlake Rare Earth Industries |
| ZnO/Zn | zinc oxide doped with zinc phosphor commercially available from Nichia America Corporation |

EXAMPLES

Preparation of Microspheres A

In a one liter resin flask equipped with mechanical stirrer, thermocouple, and inlet-outlet lines for vacuum and nitrogen, 450 grams of deionized water, 3 grams of acrylic acid were neutralized with concentrated ammonium hydroxide to a pH −7.6.0 grams of a 25% solids solution of ammonium lauryl sulfate in water was then added to the reactor. The water phase was heated to 60° C. and degassed. In a separate container, 147 grams of isooctyl acrylate and 0.71 grams of a 70% solids powder of benzoyl peroxide were combined. Once the water phase reached 60° C., the isooctyl acrylate solution was added and the reaction degassed again. A temperature of 60° C. was maintained throughout the polymerization. After 22 hours, the dispersion was cooled, filtered through cheesecloth and collected. Optical microscopy and particle size analysis revealed microspheres having a diameter of 5 to 70 microns with an average particle size of 27.5 microns. The polymer was recovered by precipitation with excess methanol, filtration and drying in a vacuum oven overnight.

Preparation of Microspheres B

In a 1000 ml beaker, 480 grams of deionized water and 5.12 grams of a 25% solids solution of ammonium lauryl sulfate in water were combined. A solution of 1.41 grams of a 75% solids powder of benozyl peroxide in 320 grams of isooctyl acrylate was then added to the beaker. The components were then stirred to create a white dispersion. The dispersion was then homogenized to produce micron sized particles. The homogenized mixture was charged into a one liter resin flask equipped with mechanical stirrer, thermocouple, and inlet-outlet lines for vacuum and nitrogen. The dispersion was heated to 65° C. and then degassed. After 25 minutes, the reaction temperature reached 75° C. The temperature then returned to 65° C. were it remained for 8 hours. The flask was then cooled, filtered through cheescloth and collected. Optical microscopy and particle size analysis revealed microspheres having a diameter of 0.5 to 5 microns with an average particle size of 2 microns. The polymer was recovered by precipitation with excess methanol, filtration and drying in a vacuum oven overnight.

Preparation of Microspheres C

In a one liter resin flask equipped with mechanical stirrer, thermocouple, and inlet-outlet lines for vacuum and nitrogen, 450 grams of deionized water, 9 grams of acrylic acid, 141 grams isooctylacrylate, and 0.7 grams of 70% solids powder of benzoyl peroxide were mixed and degassed. Once the benzoyl peroxide dissolved, 6.0 grams of 25% solids solution of ammonium lauryl sulfate in water was added. The reaction was degassed and heated to 60° C. for 20 hours. After 20 hours, the dispersion was cooled, filtered through cheesecloth and collected. Optical microscopy and particle size analysis revealed hollow microspheres having a diameter of 20 to 120 microns with an average particle size of 57 microns. The polymer was recovered by precipitation with a 0.2 wt % water solution of $AlCl_3$, filtration and drying in a vacuum oven overnight.

Preparation of Microspheres D–G

Solid microspheres D–E were prepared according to the procedure described for Microspheres A additionally comprising a multifunctional free radically polymerizable crosslinking agent (BDA). Microspheres F–G were prepared according to the procedure described for Microspheres B. Table 1 details the monomer charges used in the microsphere preparation. The diameters indicated in Table 1 represent the volume average diameter of the microsphere.

TABLE 1

Monomer Charges and Diameter of Microspheres A–G

| Microsphere | Microsphere Composition | | Diameter ($\mu$m) |
|---|---|---|---|
| A | 98/2 | IOA/AmA | 27.5 |
| B | 100 | IOA | 2 |
| C | 94/6 | IOA/AA | 57 |
| D | 98/2/0.05 | IOA/AmA/BDA | 24 |
| E | 97/2/1 | IOA/AmA/BDA | 29 |
| F | 98/2 | IOA/AmA | 1.1 |
| G | 98/2 | IOA/AA | 1.3 |

Preparation of Microsphere Dispersions

The following examples illustrate the range of dispersions obtained by formulating different compositions of microspheres and polymerizable monomer mixtures.

Preparation of Printable Dispersions

Figure 1:
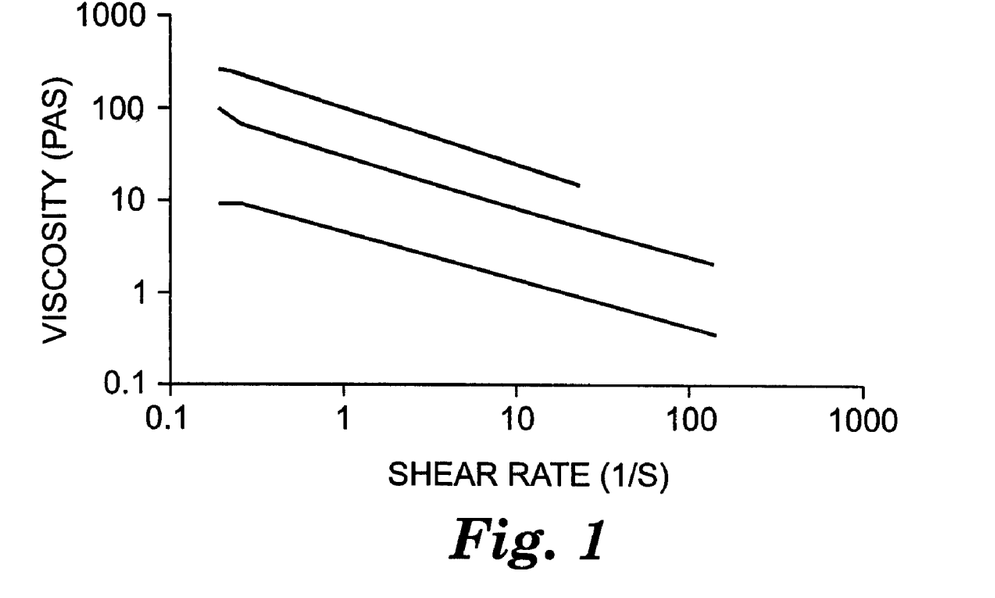
FIG. 1 is a graphical representation of a Shear Viscosity of Microsphere Dispersion and is represented by Viscosity (Pas) vs. Shear Rate (1/s).

Examples 1–18 were prepared by dispersing the dried microspheres of the composition described in Table 1 in a perform mixture containing 90 pph isooctyl acrylate (IOA) monomer, 10 pph acrylic acid (AA) monomer and 0.05 pph hexanedioldiacrylate crosslinking agent (HDDA). Next, 0.25 pph Irgacure™ 651 photoinitiator was added to the microsphere dispersion. For instance, in example 1, 25 grams of Microspheres A were swelled and dispersed in 475 grams of a preformed mixture containing 427.5 grams isooctyl acrylate monomer, 47.5 grams of acrylic acid monomer and 0.2 grams of hexandioldiacrylate crosslinking agent. This mixture was dispersed with an Omni® mixer at high speed for 2–5 minutes. 1.25 grams of Irgacure™ 651 photoinitiator was then added to the dispersion. Table 2 summarizes dispersions created with varying microsphere compositions and loadings. Referring to FIG. 1, the shear thinning characteristics for the dispersions of Examples 1–3 are shown and designated by curves 1–3, respectively.

TABLE 2

| Example | MSA | MSA Content | Polymerizable Monomers | Yield Stress (Pa) |
|---|---|---|---|---|
| 1 | A | 5 | 90/10/0.05 IOA/AA/HDDA | 1.65 |
| 2 | A | 10 | 90/10/0.05 IOA/AA/HDDA | 7.83 |
| 3 | A | 15 | 90/10/0.05 IOA/AA/HDDA | 22.77 |
| 4 | A | 2.5 | 90/10/0.05 IOA/AA/HDDA | <0.14 |
| 5 | A | 10 | IOA | 19.4 |
| 6 | A | 10 | MMA | 120 |
| 7 | A | 10 | BA | 94.3 |
| 8 | B | 10 | 90/10/0.05 IOA/AA/HDDA | 11.9 |
| 9 | B | 2.5 | IOA | <0.14 |
| 10 | C | 10 | IOA | 202 |
| 11 | D | 8 | IOA | 17.7 |
| 12 | E | 10 | IOA | <0.14 |
| 13 | F | 15 | IOA | 143 |
| 14 | F | 10 | IOA | 71.8 |
| 15 | F | 7.5 | IOA | 12.4 |
| 16 | F | 5 | IOA | 2.93 |
| 17 | F | 2.5 | IOA | <0.14 |
| 18 | G | 10 | IOA | 200 |

These examples illustrate the rheological effect of microspheres to polymerizable mixtures. As can be seen, even at low microsphere contents (5%) significant yield stresses and non-Newtonian rheological behavior are produced. FIG. 1 also demonstrates that the shear viscosity characteristics of the same polymerizable mixture can be tailored by adjusting the level of swellable, elastomeric microsphere content in the printable dispersion.

Preparation of Printable Heat Activatable Adhesives

Examples 19–22 were prepared by dispersing the dried microspheres of the composition described in Table 1 in a preformed polymerizable mixture containing 60 pph isoborny acrylate (IBOA) monomer and 40 pph isooctyl acrylate (IOA) monomer. 0.5 pph (relative to acrylate monomer) EBECRYL™ 230crosslinker and 0.3 pph LUCIRIN™ TPO photoinitiator were then dispersed into the microsphere/monomer mixture. For instance, in example 19, 25 grams of Microspheres A were swelled and dispersed in 475 grams of a preformed mixture containing 285 grams isoborny acrylate monomer (IBOA) and 190 grams of isooctyl acrylate monomer (IOA). The microspheres were dispersed into the monomer mixture with an Omni® mixer at high speed for 2–5 minutes. 2.3 grams EBECRYL™ 230 and 1.4 grams of LUCIRIN™ TPO initiator were then added and dissolved into the dispersion. Yield stress values for each of these examples was measured as described above and recorded in Table 3. Table 3 also summarizes dispersions created with varying microsphere compositions and loadings.

TABLE 3

| Example | MSA | MSA Content | Yield Stress (Pa) |
|---|---|---|---|
| 19 | A | 5 | 6.62 |
| 20 | A | 10 | 66.8 |
| 21 | B | 8 | 11.2 |
| 22 | G | 5 | 42.2 |

These examples illustrate the incorporation of microspheres in a heat activatable printable adhesive compositions. Surprisingly, despite of the incorporation of tacky microspheres, the adhesive compositions are non-tacky.

Preparation of Alpha-Olefin/Microsphere Dispersions

Examples 23–26 were prepared by dispersing the dried microspheres A or B of the composition described in Table 1 into an alpha-olefin polymerizbale monomer mixture. The microspheres were swelled in either 1-octene or 1-dodecene monomer, dispersed and cooled to 10° C. A catalyst, [{2,6-(i-Pr)$_2$C$_6$H$_3$}N=C(CH$_3$)—C(CH$_3$)=N{2,6-(i-Pr)$_2$C$_6$H$_3$}) Pd(CH$_3$)(CH$_3$Ot-Bu)]B(C$_6$F$_5$)$_4$ {catalyst preparation described in WO 97/17380}dissolved in CH$_2$Cl$_2$ was added to the dispersion. The dispersion temperature was maintained at 10° C. for 16 hours. The mixture was then precipitated with methanol, rinsed with ethyl acetate, redispersed in heptane, re-precipitated by methanol, and collected. For instance, in example 26, 10.10 gram of Microspheres A were swelled and dispersed in 190.7 grams of 1-octene. 30.20 grams of this solution was cooled to 10° C. 0.147 grams of [({2,6-(i-Pr)$_2$C$_6$H$_3$}N=C(CH$_3$)—C(CH$_3$)=N{2,6-(i-Pr)$_2$C$_6$H$_3$})Pd(CH$_3$)(CH$_3$Ot-Bu)]B(C$_6$F$_5$)$_4$ catalyst was dissolved in 1 ml CH$_2$Cl$_2$ and this catalyst solution was added to the dispersion. After 16 hours, methanol was added to the dispersion, the precipitate rinsed with ethyl acetate, redispersed in heptane and re-precipitated with methanol. The collected solid was dried at room temperature overnight. 1.8364 gram of a brown, slightly tacky solid (6% yield) was recovered. Yield stress for each of these examples was measured as described above and recorded in Table 4. Table 4 also summarizes dispersions created with varying microsphere compositions and loadings with different alpha-olefins.

TABLE 4

| Example | Microsphere Composition | Microsphere Loading (% wt) | Olefin | Yield Stress (Pa) |
|---|---|---|---|---|
| 23 | A | 5 | 1-octene | 0.23 |
| 24 | B | 5 | 1-octene | 0.52 |
| 25 | A | 4 | 1-dodecene | 0.40 |
| 26 | A | 10 | 1-octene | 41.5 |

These examples demonstrate the use of these microsphere compositions with non-acrylic polymerizable mixtures.

Preparation of Microsphere Dispersions in Presence of Thermoplastic Polymers

Figure 2:
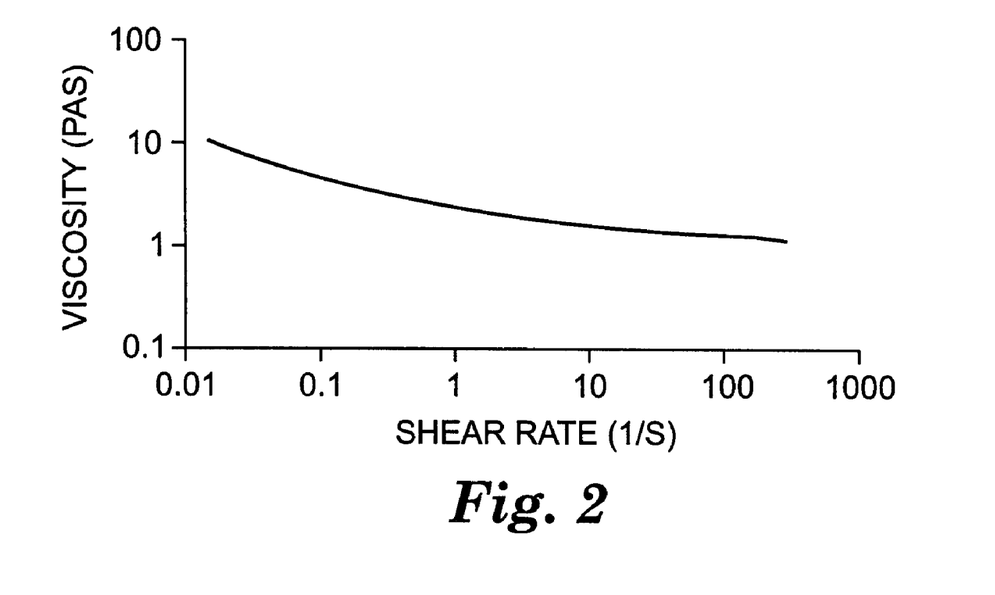
FIG. 2 is a graphical representation of a Shear Viscosity of Microsphere Dispersion with Thermoplastic Polymer Add and is represented by Viscosity (Pas) vs. Shear Rate (1/s).

Table 5 describes compositions representative of microspheres dispersed in acrylate monomer mixtures containing additional thermoplastic polymers. Examples 27–34 were prepared by dispersing the dried microspheres of the composition described in Table 1 in a preformed mixture containing acrylate monomers and thermoplastic polymer. Following dispersion of the microspheres, 0.3 pph LUCIRIN™ TPO photoinitiator (relative to acrylate monomer) was added and dissolved. For instance, in example 29, 2.0 grams of Microsphere B was added to a premixed solution of 10.0 grams of ELVACITE™ 2045 dissolved in 19.2 isooctyl acrylate monomer (IOA) and 28.8 grams of isobornyl acrylate monomer (IBOA). 0.14 grams of LUCIRIN™ TPO photoinitiator was then dissolved into the dispersion. Yield stress for each of these examples was measured as described above and recorded in Table 5. Referring to FIG. 2, the shear thinning characteristics for Example 29 is shown and designated by curve 29.

TABLE 5

| Example | MSA | Monomer Composition | MSA Content | Polymer Content | Polymer Type | Yield Stress (Pa) |
|---|---|---|---|---|---|---|
| 27 | A | 60/40 IBOA/IOA | 8 | 20 | Elvacite 2045 | 0.74 |
| 28 | B | 60/40 IBOA/IOA | 5 | 5 | Elvacite 2045 | <0.14 |
| 29 | B | 60/40 IBOA/IOA | 4 | 20 | Elvacite 2045 | 0.32 |
| 30 | B | 60/40 IBOA/IOA | 4 | 20 | K-resin | 0.61 |
| 31 | D | 90/10/0.05 IOA/AA/0.05 | 10 | 1.5 | Poly (IOA) IV = 1.7 | 131 |
| 32 | D | 90/10/0.05 IOA/AA/0.05 | 10 | 1.5 | Poly (IOA) IV = 0.7 | 103 |
| 33 | D | 90/10/0.05 IOA/AA/0.05 | 10 | 1.1 | Poly (IOA) IV = 1.1 | 202 |
| 34 | D | 90/10/0.05 IOA/AA/0.05 | 10 | 4.25 | Poly (IOA) IV = 1.1 | 0.7 |

These examples demonstrate the effect of incorporating additional thermoplastic polymers to the dispersion. The incorporation of thermoplastic polymers can be used to influence the rheological properties of the adhesive composition.

Preparation of Tackified Compositions

Examples 35–38 were prepared by dispersing the dried microspheres of the composition described in Table 1 in a preformed mixture containing acrylate monomers, thermoplastic polymer, and tackifier. Thus, for example 36, 4.0 grams of ELVACITE™ 2045 thermoplastic polymer and 2.5 grams of REGALREZ™ 1094 tackifier were dissolved in 47.5 grams of 60/40 IBOA/IOA monomer solution. 2.5 grams of Microspheres B were dispersed in this solution with an Omni® mixer run at high speed for 2–5 minutes. Yield stress for each of these examples was measured as described above and recorded in Table 6.

TABLE 6

| Example | Tackifier Level | MSA Type | MSA Content | Polymer Add | Polymer Add Level | Yield Stress (Pa) |
|---|---|---|---|---|---|---|
| 35 | 5 | B | 5 | none | 0 | 1.67 |
| 36 | 5 | B | 5 | Elvacite 2045 | 8 | 0.18 |
| 37 | 15 | B | 5 | Elvacite 2045 | 8 | 0.22 |
| 38 | 5 | A | 10 | Elvacite 2045 | 4 | 0.88 |

These examples illustrate the use of tackifiers within the adhesive compositions. Tackification allows for further manipulation of the rheological and adhesive performance of these compositions.

Preparation of Microsphere Dispersion with Luminescent Particles

Examples 39 and 40 describe compositions representative of microspheres dispersed in acrylate monomer mixtures containing luminescent particles. Microspheres were dispersed into the monomer solution with an Omni® mixer at high speed for 2–5 minutes. Luminescent particles and 0.25 pph IRGACURE™ 651 photoinitiator were stirred into the dispersion. Yield stress for each of these examples was measured as described above and recorded in Table 7.

Luminescence for examples 39 and 40 was demonstrated optically by exposing both the polymerizable mixture and the adhesive to shortwave length UV radiation.

TABLE 7

| Example | MSA Type | MSA Content | Monomer Composition | Particle | Particle Content | Yield Stress (Pa) |
|---|---|---|---|---|---|---|
| 39 | A | 9.5 | 85/15 IOA/AA | $(Y,Eu)_2O_3$ | 2.3 | 20.6 |
| 40 | A | 5 | IOA | ZnO/Zn | 0.4 | 1.53 |

Comparative Examples

Comparative Examples C1–C3 illustrate attempts to incorporate other polymeric particles to create printable dispersions. The latex particles were loaded at 5 pph in 90/10/0.05 IOA/AA/HDDA monomer mixture. The particles were dispersed with an Omni® mixer run at high speed for 2–5 minutes. Dispersion quality was inspected visually. Particle sedimentation within one hour mixing indicated a poor dispersion. Yield stress for each of these examples was measured as described above and recorded in Table 8.

TABLE 8

| Comparative Example | Particle | Yield Stress (Pa) | Dispersion Quality |
|---|---|---|---|
| C1 | KM330 | <0.14 | Poor |
| C2 | 2691A | <0.14 | Good |
| C3 | AC3355 | <0.14 | Poor |

In contrast to the swellable, elastomeric microsphere component of the composition described in the present invention, the core/shell latex particles failed to provide the compositions with the proper rheological properties for contact printing.

Printing of Microsphere Dispersions—Flat Bed Screen Printing

The following examples illustrate the use of microsphere dispersions for flat bed screen printing. Dispersions were printed on 50 micron (2 mil) vinyl polyester mesh screens with a standard ABC pattern to produce a patterned adhesive onto either PET or vinyl films. The mesh sizes of the screens included 40, 110, 157, 160, 230, 325, 390. Not all dispersion were printed on all mesh screens. The table indicates the mesh sizes of screens employed. Printed dispersions were cured in inert chambers at an exposure sufficient to cure the dispersion. Print quality was determined by optical resolution of the printed pattern. Retention of resolution led to good to excellent print performance. Samples with poor print quality tended to leak through the screen prior to printing. This resulted in poor image resolution.

TABLE 9

| Example | Dispersion Example | Screen Size (mesh) | Adhesive | Yield Stress (Pa) | Print Quality |
|---|---|---|---|---|---|
| 41 | 1 | 40–390 | tacky | 1.65 | good |
| 42 | 2 | 157–390 | tacky | 7.8 | good |
| 43 | 3 | 40–390 | tacky | 22.77 | good |
| 44 | 43 | 157–390 | tacky | 20.6 | good |
| 45 | 9 | 157–390 | tacky | <0.14 | poor |
| 46 | 4 | 157–390 | tacky | <0.14 | poor |

TABLE 9-continued

| Example | Dispersion Example | Screen Size (mesh) | Adhesive | Yield Stress (Pa) | Print Quality |
|---|---|---|---|---|---|
| 47 | 29 | 325 | non-tacky | 0.32 | good |
| 48 | 27 | 325 | non-tacky | 0.74 | good |
| 49 | 30 | 325 | non-tacky | 0.61 | good |
| 50 | 19 | 325 | non-tacky | 6.62 | good |
| 51 | 20 | 325 | non-tacky | 66.8 | good |
| 52 | 21 | 325 | non-tacky | 11.2 | good |

Preparation of Microsphere Dispersions Containing Conductive Particles

Examples 53–56 demonstrate that in addition to thermoplastic polymers, conductive particles may be added to the printable adhesive dispersions of the present invention which to produce conductive adhesives. 20 pph gold coated nickel particles (4% gold coating on nickel, 100% mesh size—38 microns, available from Novamet, Inc.) were dispersed with a high speed mixer into a dispersion containing the amounts of microspheres B listed in Table 10 in a 60/40 IBOA/IOA polymerizable monomer mixture. Samples were screen printed onto a flexible electrical circuit (3M™ Brand Heat Seal Connector without adhesive, available from Minnesota Mining and Manufacturing Co., St. Paul, Minn.) using a flat bed screen printer (Model 2BS Roll to Roll Screen Press System from Rolt Engineering Ltd.) with a 325 stainless steel screen. The screen printed adhesive was cured by irradiation with ultraviolet light at an intensity of about 4.5 to 5.5 milliWatts/square centimeter, and a total energy of about 335 to 350 milliJoules/square centimeter. The flexible circuits with printed adhesive were then bonded to FR-4 circuit board and indium tin oxide coated glass as described above. The bonded printed flexible circuit was tested for both electrical resistance and 90° peel adhesion to both an ITO glass substrate and to a FR-4 circuit board according to the test methods described above. Test results are shown in Table 10.

TABLE 10

| Example | MSA Dispersion | Resist. (ohms) | Peel Adhesion - ITO (g/cm) | Peel Adhesion - PCB (g/cm) | Thickness (mils) |
|---|---|---|---|---|---|
| 53 | 21 | 1-2 | 143 | 122 | 0.8 |
| 54 | 27 | 1-2 | 164 | 476 | 0.7 |
| 54 | 29 | 1-2 | 32 | 349 | 0.8 |
| 56 | 30 | 1-2 | 144 | 212 | 1.5 |

These examples illustrate that both good electrical connections and adhesive performance are achieved with these compositions.

Rotary Screen Printing

The following examples were screen printing using a rotary screen press. Samples were printed onto PET film and cured in an inert atmosphere. Table 11 illustrates the performance of the microsphere dispersions on a stainless steel mesh screen consisting of four different screen sizes, from 20 to 60 mesh and an overall circumference of 62.14 cm. Printing parameters were varied from a blade height of 0 to and an in/out measurement of 25–35 to achieve optimal printability for each sample. The polymer syrup employed as comparative examples C4 and C5 was synthesized according to the procedures outlined in Example 1 of U.S. Pat. No. 4,181,752. No swellable, elastomeric microspheres were incorporated into the syrup of Comparative Examples C5–C6.

TABLE 11

| Example | Dispersion Example | Coating Speed | Yield stress | Print Quality |
|---|---|---|---|---|
| 57 | 1 | 5 | 1.65 | good |
| 58 | 1 | 20 | 1.65 | good |
| 59 | 2 | 20 | 7.83 | good |
| 60 | 3 | 20 | 22.77 | good |
| C4 | Syrup | 5 | ND | good |
| C5 | Syrup | 20 | ND | very poor |

ND - not determined

Only the comparative example of the syrup failed to print at speeds above 15 ft/min. Excess stringing resulting in poor resolution was noted with this material. The microsphere dispersions printed cleanly even at 20 ft/min.

Various modifications and alterations of this invention will become apparent to those skilled in the art without departing from the scope and principles of this invention, and it should be understood that this invention is not to be unduly limited to the illustrative embodiments set forth hereinabove. All publications and patents are incorporated herein by reference to the same extent as if each individual publication or patent was specifically and individually indicated to be incorporated by reference.

What is claimed is:

1. A method of using a contact printable adhesive composition comprises the steps of: (a) providing a printable adhesive composition comprising: (i) a single rheological modifier of swellable, elastomeric microspheres, and (ii) at least one polymerizable monomer or a mixture of polymerizable monomers capable of swelling the microspheres, and (b) applying the printable adhesive composition to a substrate using a contact printing process.

2. The method of using a contact printable adhesive composition according to claim 1, wherein the contact printable adhesive composition further comprises one or more of a thermoplastic polymer or copolymer, a semicrystalline polymer, or a macromer.

3. The method of using a contact printable adhesive composition according to claim 2, wherein the thermoplastic polymer is an acrylic polymer and the thermoplastic copolymer is an acrylic copolymer.

4. The method of using a contact printable adhesive composition according to claim 1, wherein the contact printable adhesive composition further comprises electrically conductive or luminescent particles.

5. The method of using a contact printable adhesive composition according to claim 1, wherein the microspheres are solid microspheres, hollow microspheres or mixtures thereof.

6. The method of using a contact printable adhesive composition according to claim 5, wherein the volume average diameter of the solid microspheres and hollow microspheres is in the range of 1 to 100 micrometers before swelling.

7. The method of using a contact printable adhesive composition according to claim 1, wherein the composition is substantially solvent free.

8. The method of using a contact printable adhesive composition according to claim 1, wherein the composition exhibits pseudoplastic rheological behavior.

9. The method of using a contact printable adhesive composition according to claim 1, wherein the polymerizable monomer or mixture of polymerizable monomers capable of swelling the microspheres comprise alkyl acrylate monomers, monoethylenically unsaturated comonomers or α-olefin monomers.

10. The method of using a contact printable adhesive composition according to claim 9, wherein the polymerizable monomer or mixture of polymerizable monomers capable of swelling the microspheres includes at least an unsaturated monofunctional (meth)acrylic acid esters of non-tertiary alkyl alcohols having from 2 to 20 carbon atoms in the alkyl moiety.

11. The method of using a contact printable adhesive composition according to claim 1, wherein the contact printable adhesive composition further comprises one or more of an initiator, a crosslinking agent, a tackifying agent, or a chain transfer agent.

12. The method of using a contact printable adhesive composition according to claim 1, wherein the swellable, elastomeric microspheres are swellable, elastomeric acrylate or vinyl ester microspheres; and the contact printable adhesive composition comprises:

(a) about 2.5 to about 15% by weight microspheres; and (b) about 85 to about 97.5% by weight monomers.

13. The method of using a contact printable adhesive composition according to claim 12, wherein the contact printable adhesive composition comprises:

(a) about 5 to about 10% by weight microspheres; and (b) about 90 to about 95% by weight monomers.

14. The method according to claim 1, wherein the contact printing process is screen printing.

15. An article of commerce comprising: (i) a substrate having a major surface, and (ii) a contact printed pattern of an adhesive on the major surface of the substrate, wherein the adhesive comprises (a) a single rheological modifier of swellable, elastomeric microspheres, and (b) at least one polymerizable monomer or a mixture of polymerizable monomers capable of swelling the microspheres.

16. The article of commerce of claim 15 wherein component (b) includes at least one α-olefin monomer capable of swelling the microspheres.

17. The article of commerce of claim 15 wherein the adhesive is heat activatible.

18. The article according to claim 17, wherein the article is a flexible circuit.

19. An article of commerce comprising: (i) a substrate having a major surface, and (ii) a contact printed pattern of an adhesive on the major surface of the substrate, wherein the adhesive comprises the polymerization product of (a) a single rheological modifier of swellable, elastomeric microspheres, and (b) at least one polymerizable monomer or a mixture of polymerizable monomers capable of swelling the microspheres.

20. The article of commerce of claim 19 wherein component (b) includes at least one α-olefin monomer capable of swelling the microspheres.

21. The article of commerce of claim 19 wherein the adhesive is heat activatible.

22. The article of commerce of claim 19, wherein the article is a flexible circuit.

23. A method of using a contact printable adhesive composition comprising the steps of: (a) providing a printable adhesive composition consisting essentially of: (i) swellable, elastomeric microspheres, and (ii) at least one polymerizable monomer or a mixture of polymerizable monomers capable of swelling the microspheres, and (b) applying the printable adhesive composition to a substrate using a contact printing process.

24. The method according to claim 23, wherein the contact printing process is screen-printing.

25. An article of commerce comprising: (i) a substrate having a major surface, and (ii) a contact printed pattern of an adhesive on the major surface of the substrate, wherein the adhesive consists essentially of (a) swellable, elastomeric microspheres, and (b) at least one polymerizable monomer or a mixture of polymerizable monomers capable of swelling the microspheres.

26. The article of claim 25 wherein component (b) includes at least an α-olefin monomer capable of swelling the microspheres.

27. The article of claim 25 wherein the adhesive is heat activatible.

28. The article according to claim 27, wherein the article is a flexible circuit.

29. An article of commerce comprising: (i) a substrate having a major surface, and (ii) a contact printed pattern of an adhesive on the major surface of the substrate, wherein the adhesive consists essentially of the polymerization product of (a) swellable, elastomeric microspheres, and (b) at least one polymerizable monomer or a mixture of polymerizable monomers capable of swelling the microspheres.

* * * * *